(12) United States Patent
Oka et al.

(10) Patent No.: US 6,174,462 B1
(45) Date of Patent: Jan. 16, 2001

(54) CONDUCTIVE PASTE COMPOSITION INCLUDING CONDUCTIVE METALLIC POWDER

(75) Inventors: Kengo Oka, Nukata-gun; Takashi Nagasaka, Anjo; Yuji Ootani, Okazaki; Kazumasa Naito, Odawara; Masayuki Miyairi, Isehara, all of (JP)

(73) Assignee: Denso Corporation, Kariya (JP)

( * ) Notice: Under 35 U.S.C. 154(b), the term of this patent shall be extended for 0 days.

(21) Appl. No.: 09/233,153

(22) Filed: Jan. 19, 1999

(30) Foreign Application Priority Data

Jan. 20, 1998 (JP) .................................................. 10-009046

(51) Int. Cl.⁷ .................................................. H01B 1/02
(52) U.S. Cl. .......................... 252/514; 252/509; 252/508; 252/513; 252/519.14; 252/519.3
(58) Field of Search ..................... 252/514, 508, 252/509, 513, 519.14, 519.3, 520.3

(56) References Cited

U.S. PATENT DOCUMENTS

| | | | |
|---|---|---|---|
| 4,369,063 | * | 1/1983 | McGowan, Jr. ..................... 106/1.14 |
| 5,198,154 | | 3/1993 | Yokoyama et al. ................... 252/514 |
| 5,766,516 | * | 6/1998 | Fukuta et al. ......................... 252/514 |

FOREIGN PATENT DOCUMENTS

| | | |
|---|---|---|
| 52-54194 | 5/1977 | (JP) . |
| 55-151707 | 11/1980 | (JP) . |
| 58-83073 | 5/1983 | (JP) . |
| 59-46701 | 3/1984 | (JP) . |
| 59-46702 | 3/1984 | (JP) . |
| 59-51406 | 3/1984 | (JP) . |
| 61-251101 | 11/1986 | (JP) . |
| 62-140304 | 6/1987 | (JP) . |
| 62-285314 | 12/1987 | (JP) . |
| 64-9883 | 1/1989 | (JP) . |
| 64-81106 | 3/1989 | (JP) . |
| 4-192208 | 7/1992 | (JP) . |
| 6-239646 | 8/1994 | (JP) . |
| 8-148030 | 6/1996 | (JP) . |

\* cited by examiner

Primary Examiner—Yogendra Gupta
Assistant Examiner—Derrick G. Hamlin
(74) Attorney, Agent, or Firm—Pillsbury Madison & Sutro LLP

(57) ABSTRACT

A circuit board comprises wiring parts containing silver on a substrate, and a conductivity suppressing agent such as a potassium compound provided between the wiring parts, for preventing the silver attached on the substrate between the wiring parts from being conductive. Therefore, the insulation deterioration between the wiring parts can be suitably suppressed, which usually occurs when a voltage is applied between the wiring parts containing silver on the substrate under a high temperature atmosphere, irrespective of the presence or absence of water or water vapor. That is, the high temperature leakage phenomenon can be suitably suppressed.

23 Claims, 10 Drawing Sheets

FIG. 4
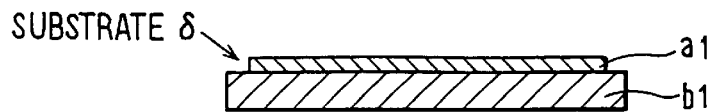
FIG. 5
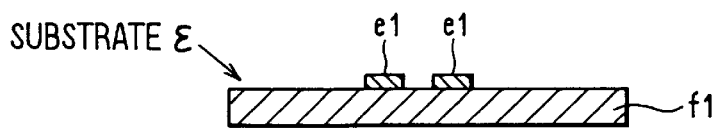
FIG. 6
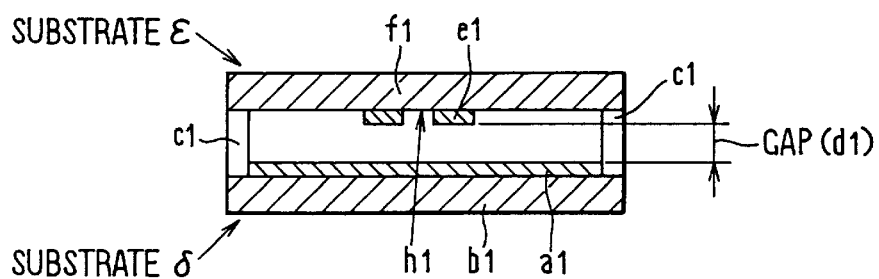
FIG. 7A    FIG. 7B
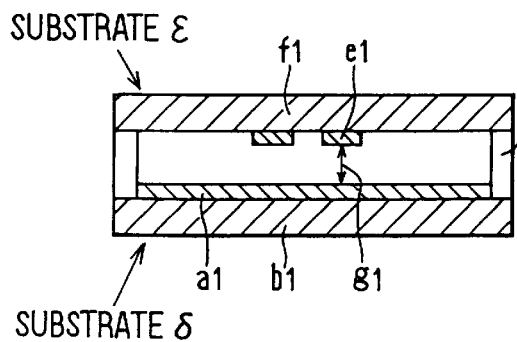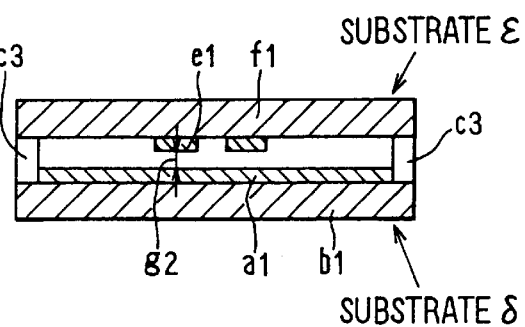

FIG. 12

| BISMUTH COMPOUND | A | BISMUTH OXIDE |
| --- | --- | --- |
| | B | BISMUTH OCTYLATE |
| POTASSIUM COMPOUND | A | POTASSIUM OXIDE |
| | B | GLUCONIC ACID POTASSIUM |
| GLASS FRIT | A | $B_2O_3(20)-SiO_2(10)-PbO(5)-ZnO(55)-K_2O(10)$ |
| | B | $B_2O_3(20)-SiO_2(10)-PbO(10)-ZnO(60)$ |
| | C | $B_2O_3(10)-SiO_2(10)-PbO(70)-ZnO(10)$ |
| | D | $SiO_2(40)-ZnO(15)-Al_2O_3(15)-CaO(20)-K_2O(10)$ |
| | E | $B_2O_3(8)-SiO_2(50)-Al_2O_3(15)-CaO(25)-MgO(2)$ |
| | F | $B_2O_3(8)-SiO_2(15)-PbO(55)-ZnO(17)-K_2O(5)$ |

FIG. 13

| SAMPLE | CONDUCTIVE METALLIC POWDER | | MIXING RATIO RELATIVE TO 100 WEIGHT CONTENT OF CONDUCTIVE METALLIC POWDER (RESPECTIVE COMPOUNDS ARE CONVERTED TO THEIR OXIDES) | | | | | | | SOLDER WETTABILITY [mm] | SOLDER ADHESION STRENGTH [Kg/2mm□] | HIGH TEMP. LEAKAGE CHARACTERISTICS [%] |
|---|---|---|---|---|---|---|---|---|---|---|---|---|
| | SILVER | Pd Pt | POTASSIUM COMPOUND | BISMUTH COMPOUND | GLASS FRIT | Ru OXIDE | NICKEL OXIDE | COPPER OXIDE | V OXIDE | | | |
| 1 | 100 | — — | — | — | A 1.0 | — | — | 0.5 | — | 0.472 | 0.9 | 20 |
| 2 | 100 | — — | A 0.10 | — | A 1.0 | — | — | 0.5 | — | 0.477 | 0.9 | 100 |
| 3 | 100 | — — | — | A 2.0 | A 1.0 | — | — | 0.5 | — | 0.321 | 2.3 | 50 |
| 4 | 100 | — — | A 0.01 | A 2.0 | A 1.0 | — | — | 0.5 | — | 0.325 | 2.3 | 90 |
| 5 | 100 | — — | A 0.05 | A 2.0 | A 1.0 | — | — | 0.5 | — | 0.342 | 2.4 | 98 |
| 6 | 100 | — — | A 0.10 | A 2.0 | A 1.0 | — | — | 0.5 | — | 0.386 | 1.9 | 100 |
| 7 | 100 | A 0.20 | A 2.0 | A 1.0 | — | — | 0.5 | — | 0.402 | 1.7 | 100 |
| 8 | 100 | — — | A 0.40 | A 2.0 | A 1.0 | — | — | 0.5 | — | 0.498 | 1.4 | 100 |
| 9 | 100 | — — | B 0.10 | A 2.0 | A 1.0 | — | — | 0.5 | — | 0.388 | 1.8 | 100 |
| 10 | 100 | — — | C 0.10 | A 2.0 | — | — | — | 0.5 | — | 0.375 | 2.0 | 100 |
| 11 | 100 | — — | A 0.10 | B 2.0 | A 1.0 | — | — | 0.5 | — | 0.377 | 1.9 | 100 |
| 12 | 100 | — — | A 0.10 | A 1.0 | B 1.5 | — | — | 2.0 | — | 0.362 | 2.0 | 98 |
| 13 | 100 | — — | ※ 0.05 | A 1.0 | C 0.5 | — | — | 1.0 | — | 0.353 | 2.1 | 100 |
| 14 | 100 | — — | A 0.10 | A 10.0 | D 4.0 | 1.0 | — | — | — | 0.329 | 3.5 | 100 |
| 15 | 100 | — 10 | A 0.10 | A 10.0 | A 3.0 | — | — | 2.0 | — | 0.365 | 3.6 | 98 |

FIG.14

| SAMPLE | CONDUCTIVE METALLIC POWDER | | | MIXING RATIO RELATIVE TO 100 WEIGHT CONTENT OF CONDUCTIVE METALLIC POWDER (RESPECTIVE COMPOUNDS ARE CONVERTED TO THEIR OXIDES) | | | | | | | SOLDER WETTABILITY [mm] | SOLDER ADHESION STRENGTH [Kg/2mm□] | HIGH TEMP. LEAKAGE CHARACTER-ISTICS [%] |
|---|---|---|---|---|---|---|---|---|---|---|---|---|---|
| | SILVER | Pd | Pt | POTASSIUM COMPOUND | BISMUTH COMPOUND | GLASS FRIT | Ru OXIDE | NICKEL OXIDE | COPPER OXIDE | V OXIDE | | | |
| 16 | 80 | 20 | — | A 0.10 | A 20.0 | D 6.0 | 2.0 | — | — | — | 0.368 | 3.2 | 100 |
| 17 | 99 | — | 1 | A 0.10 | A 10.0 | D 4.0 | 1.0 | — | — | — | 0.329 | 3.5 | 100 |
| 18 | 99 | — | 1 | ✕ 0.10 | A 4.0 | D 3.0 E 2.0 | 0.8 | 0.2 | — | — | 0.352 | 2.7 | 93 |
| 19 | 99 | — | 1 | ✕ 0.10 | A 8.0 | D 3.0 E 2.0 | 0.8 | 0.2 | — | — | 0.321 | 2.9 | 100 |
| 20 | 99 | — | 1 | ✕ 0.10 | A 12.0 | D 3.0 E 2.0 | 0.8 | 0.2 | — | — | 0.359 | 2.8 | 100 |
| 21 | 99 | — | 1 | ✕ 0.10 | A 16.0 | D 3.0 E 2.0 | 0.8 | 0.2 | — | — | 0.554 | 2.6 | 100 |
| 22 | 99 | — | 1 | ✕ 0.10 | A 8.0 | D 3.0 E 2.0 | — | 0.2 | — | — | 0.782 | 1.1 | 100 |
| 23 | 99 | — | 1 | ✕ 0.10 | A 8.0 | D 3.0 E 2.0 | 0.4 | 0.2 | — | — | 0.373 | 2.4 | 100 |
| 24 | 99 | — | 1 | ✕ 0.10 | A 8.0 | D 3.0 E 2.0 | 1.2 | 0.2 | — | — | 0.291 | 3.7 | 90 |
| 25 | 99 | — | 1 | ✕ 0.10 | A 8.0 | D 3.0 E 2.0 | 2.0 | 0.2 | — | — | 0.617 | 3.6 | 67 |
| 26 | 99 | — | 1 | ✕ 0.10 | A 8.0 | D 3.0 E 2.0 | 0.8 | — | — | — | 0.346 | 1.2 | 100 |
| 27 | 99 | — | 1 | ✕ 0.10 | A 8.0 | D 3.0 E 2.0 | 0.8 | 0.1 | — | — | 0.326 | 2.2 | 100 |
| 28 | 99 | — | 1 | ✕ 0.10 | A 8.0 | D 3.0 E 2.0 | 0.8 | 0.4 | — | — | 0.367 | 3.1 | 93 |
| 29 | 99 | — | 1 | ✕ 0.10 | A 8.0 | D 3.0 E 2.0 | 0.8 | 0.5 | — | — | 0.421 | 3.3 | 67 |
| 30 | 80 | 20 | — | — | A 5.0 | A 3.0 | — | — | — | 1.0 | 0.332 | 3.6 | 0 |
| 31 | 80 | 20 | — | A 0.20 | A 5.0 | A 3.0 | — | — | — | 1.0 | 0.354 | 3.5 | 96 |

FIG.15

| SAMPLE | CONDUCTIVE METALLIC POWDER | | | MIXING RATIO RELATIVE TO 100 WEIGHT CONTENT OF CONDUCTIVE METALLIC POWDER | HIGH TEMP. LEAKAGE CHARACTERISTICS [%] |
|---|---|---|---|---|---|
| | SILVER | Pd | Pt | GLASS FRIT | |
| 40 | 100 | — | — | A 1.0 | 100 |
| 41 | 100 | — | — | B 1.0 | 100 |
| 42 | 100 | — | — | A 0.5  B 0.5 | 100 |
| 43 | 90 | 10 | — | A 1.0  B 1.0 | 100 |
| 44 | 99 | — | 1 | A 0.5  B 0.5 | 100 |

GLASS FRIT

A : $B_2O_3(10)-SiO_2(50)-Al_2O_3(15)-CaO(25)$ SOFTENING POINT : 790°C

B : $B_2O_3(10)-SiO_2(15)-PbO(75)$ SOFTENING POINT : 380°C

FIG.17

| SAMPLE | CONDUCTIVE METALLIC POWDER | | | MIXING RATIO RELATIVE TO 100 WEIGHT CONTENT OF CONDUCTIVE METALLIC POWDER | | CONDUCTIVE FILM RESISTANCE [mΩ/☐] | HIGH TEMP. LEAKAGE CHARACTERISTICS [%] |
|---|---|---|---|---|---|---|---|
| | SILVER | Pd | Pt | GLASS FRIT | DIBISMUTH PENTOXIDE | | |
| 50 | 100 | — | — | A 45 | — | 2.1 | 100 |
| 51 | 100 | — | — | A 60 | — | 2.2 | 100 |
| 52 | 100 | — | — | A 100 | — | 4.8 | 100 |
| 53 | 100 | — | — | B 60 | — | 3.7 | 100 |
| 54 | 90 | 10 | — | A 60 | — | 12.0 | 100 |
| 55 | 99 | — | 1 | A 60 | — | 2.4 | 100 |
| 56 | 100 | — | — | — | 60 | 3.2 | 100 |

GLASS FRIT
A : B2O3(10)−SiO2(10)−PbO(70)−ZnO(10)
B : B2O3( 5)−SiO2(60)−CaO(20)−Al2O3(10)−MgO( 5)

FIG. 18

| SAMPLE | CONDUCTIVE METALLIC POWDER | | | MIXING RATIOS OF RESPECTIVE OXIDES RELATIVE TO 100 WEIGHT CONTENT OF CONDUCTIVE METALLIC POWDER | | SOLDER ADHESION STRENGTH [Kg/2mm□] | HIGH TEMP. LEAKAGE CHARACTERISTICS [%] |
|---|---|---|---|---|---|---|---|
| | SILVER | Pd | Pt | | | | |
| 60 | 100 | — | — | — | — | — | 100 |
| 61 | 90 | 10 | — | — | — | — | 100 |
| 62 | 99 | — | 1 | — | — | — | 100 |
| 63 | 100 | — | — | DIBISMUTH PENTOXIDE | 0.5 | 0.7 | 100 |
| 64 | 100 | — | — | COPPER SUBOXIDE | 0.2 | 0.8 | 100 |
| 65 | 100 | — | — | MANGANESE DIOXIDE | 0.2 | 0.6 | 100 |
| 66 | 100 | — | — | ZINC OXIDE | 0.1 | 0.9 | 100 |
| 67 | 100 | — | — | DICHROMIUM TRIOXIDE | 0.1 | 0.7 | 100 |
| 68 | 100 | — | — | NICKEL OXIDE | 0.1 | 0.5 | 100 |
| 69 | 100 | — | — | TITANIUM DIOXIDE | 0.1 | 0.6 | 100 |
| 70 | 100 | — | — | SILICON DIOXIDE | 0.1 | 0.9 | 100 |

CONDUCTIVE PASTE COMPOSITION INCLUDING CONDUCTIVE METALLIC POWDER

CROSS REFERENCE TO RELATED APPLICATION

This application is based upon and claims the benefit of priority of Japanese Patent Application No. 10-9046 filed on Jan. 20, 1998, the contents of which are incorporated herein by reference.

BACKGROUND OF THE INVENTION

1. Field of the Invention

The present invention relates to an insulating paste composition and a conductive paste composition for a circuit board.

2. Related Art

A thick film circuit board is known as a circuit board, which comprises an insulating substrate formed by, for example, alumina, having thereon a conductive paste composition printed and baked. The conductive paste composition comprises conductive metal powder main components of which are silver and palladium (Pd) or a noble metal such as platinum, and an inorganic binder such as a glass frit, which are dispersed in an organic vehicle.

Recently, a circuit board is highly demanded to have a high density, a compact size and environment durability. For example, in an IC circuit board for an automobile, it is considered that high integration due to the use of hybrid ICs is demanded, and the installation in an engine room of the board, which has been installed in a vehicle cabin, is required.

Accordingly, wiring parts formed on an insulating substrate are required to have higher reliability characteristics than the past. For example, even when a voltage is applied between the wiring parts having a narrow wiring distance therebetween and the board is put under an outer environment for a long period of time, the insulating property between the wiring parts should not be deteriorated.

However, it is generally known that, when the wiring part is formed by using a conductive paste containing silver on an insulating substrate, silver contained in the wiring part is ionized on application of a voltage in the presence of water or water vapor and moves from a positive electrode part to a negative electrode part causing dendrites of silver, and the so-called migration of silver is liable to occur, which results in deterioration in insulating property between the wiring parts. Therefore, a sealing structure has been employed to prevent the migration of silver.

However, the inventors found a phenomenon in that the insulation resistance is lessened on application of a voltage under a high temperature atmosphere even if water or water vapor is not present. The phenomenon is described below with reference to the results of experiments conducted by the inventors.

The phenomenon can be summarized as follows. For example, when wiring parts containing silver are arranged on an insulating substrate with a narrow distance of about 100 $\mu$m therebetween, a voltage of about 16 V (the maximum standard for electric devices installed in an automobile) is applied between the wiring parts, and it is put under a high temperature atmosphere of about 150° C., the insulating resistance between the wiring parts is greatly lowered with the lapse of time, and at last, insulation failure therebetween occurs.

The phenomenon occurs under an atmosphere in that no water content is present, such as at a temperature of 100° C. or higher, or in vacuum. Furthermore, when the wiring parts are in a state of substantially short-circuit, dendrites of silver is not observed between the wiring parts, which must be observed on generation of the migration under the presence of water content, and polarity is also not observed in the phenomenon (i.e., the phenomenon occurs irrespective of the polarity of a positive electrode part and a negative electrode part). Accordingly, it can be determined that this is a phenomenon newly found, which is different from the migration occurring under the presence of water content. Such a phenomenon is called a high temperature leakage phenomenon hereinafter.

Although the mechanism of the phenomenon is not completely clarified, the summary is as follows according to the investigation by the inventors.

Conventionally, wiring parts on a general thick film circuit board are obtained by printing a conductive paste composition on an insulating substrate such as a ceramic substrate formed by alumina, followed by baking. The conductive paste composition comprises conductive metallic powder containing silver and an inorganic binder such as glass frit, which are dispersed in an organic vehicle. The conductive paste composition is generally baked at a temperature of from 800° C. to 900° C. During the baking, parts of the silver and the inorganic binder are evaporated from the wiring parts formed on the insulating substrate by printing, and they are attached as a reaction product containing silver on the insulating substrate. Since the reaction product is generally present in an extremely thin form, it is generally not observed. The reaction product has an insulating property, which is the same as the underlying insulating substrate.

However, when a voltage is applied between the wiring parts between which the reaction product is present and it is put under a high temperature atmosphere without influence of water content (which is called a high temperature atmosphere hereinafter), silver contained in the reaction product comes to have conductive nature, and the insulating property between the wiring parts is lessened with the lapse of time.

The mechanism of the high temperature leakage phenomenon summarized above was clarified by the following some verification experiments (verification experiment A and verification experiment B).

The verification experiment A is described below. A circuit board was prepared, on which wiring parts having plural wiring distances different from each other were formed by using a general conductive paste composition containing silver by printing and baking on a ceramic substrate formed by alumina. A voltage was applied between the wiring parts, and it was put under a high temperature atmosphere. In the verification experiment A, the voltage applied between the wiring parts had a value (for example 60 V), which was higher than the voltage generally applied, for reaction enhancement.

It was found as shown in FIG. 1 that the insulating resistance value between the wiring parts was lowered with the lapse of time under the high temperature atmosphere. FIG. 1 is a graph showing the relationship between the time lapsing under a high temperature atmosphere and the insulating resistance value (Log10X, unit:$\Omega$). In the plot marks in the figure, white circles and black circles are for the case of the temperature 125° C., white triangles and black triangles are for the case of the temperature 150° C., white circles and white triangles are for the case of a wiring distance 100 μm, and black circles and black triangles are for the case of a wiring distance 50 μm.

At these cases, appearance change such as the known dendrites of silver generated by water content was not observed at the wiring parts between which insulating resistance value lowers. Therefore, it was found that the phenomenon had nature influenced by conditions, such as the wiring distance, the applied voltage and the ambient temperature.

Furthermore, the time when the insulating resistance value lowers to 100 MΩ was investigated as an insulation failure time in the relationship with the electric field intensity, which could be obtained from the voltage applied between the wiring parts. The results are shown in FIG. 2. FIG. 2 is a graph showing the relationship between the electric filed intensity and the insulation failure time. In the plot marks in the figure, circles are for the case of a temperature 150° C., and triangles are for the case of a temperature 125° C.

It was found from the results of the verification experiment A shown in FIGS. 1 and 2 that the deterioration of insulating property between the wiring parts depends on the wiring distance and the electric field intensity determined by the applied voltage, and is farther accelerated, the higher the ambient temperature is.

The detail observation was carried out to investigate the reason of the deterioration of insulating property.

No appearance change was observed before and after the insulation deterioration by the observation using a scanning electron microscope (SEM) with respect to the wiring parts, between which the insulation deterioration was observed, and its surroundings. Furthermore, the substances present in the same place were analyzed by an electron probe microanalyzer (EPMA) equipped with a wavelength dispersing X-ray analyzer, but no difference was observed before and after the insulation deterioration.

However, parts of the silver and the inorganic binder as the compositions of the conductive paste, which were not contained in the ceramic substrate by itself, were observed on the ceramic substrate after the insulation deterioration. They were present in the surroundings of the wiring parts, and the larger their amount, the nearer to the wiring parts.

The specific state where they were present was observed by a transmission electron microscope (TEM). As a result, it was confirmed as shown in FIG. 3 that fine silver particles A3 are present in the part of the glass substance A2 present at the boundaries of the alumina particles A1.

The reason of the above is estimated as follows. In the surroundings of the wiring parts which is formed by printing and baking the conductive paste, parts of the silver and the inorganic binder are evaporated and attached on the ceramic substrate when the conductive paste is baked. At this time, the glass substance present at the boundaries of the alumina particles of the alumina ceramic substrate is softened, and the evaporated material is liable to be absorbed.

It is of course that when a ceramic substrate, on which no conductive paste is printed and baked, is observed in the similar manner, the attachment of the compositions of the conductive paste, such as silver particles, is not observed. It was thus found that parts of the silver and the inorganic binder contained in the conductive paste contributes to the high temperature leakage phenomenon in any way.

The following verification experiment (verification experiment B) was conducted to investigate the reason why parts of the silver and the inorganic binder are present in the surroundings of the wiring parts. As a result, it was confirmed that a substance produced by reacting the inorganic binder and the silver (abbreviated as reaction product hereinafter) is attached onto the substrate when the conductive paste is baked, and electrical conduction thereof is caused by the silver contained in the reaction product.

As a first step of the verification experiment B, the verification experiment B1 using a board α, a board β and a board γ is described.

The board α is a general circuit board, in which the deterioration of an insulation property occurs in the wiring parts. The board β was produced by the following manner. Wiring parts were formed by printing and baking a conductive paste containing silver on an insulating substrate, and a groove was formed on the surface of the insulating substrate between the wiring parts in parallel to the wiring parts by a trimming method using laser, which is generally used to adjust resistance of a thick film resistor (abbreviated as the laser trimming hereinafter), so as to mechanically remove the reaction product present between the wiring parts.

The board γ was produced by firstly forming a groove on the surface of the insulating substrate between the wiring parts in the same manner as described above using the laser trimming, and then forming the wiring parts by printing and baking.

A voltage was applied between the wiring parts of each of the board α, the board β and the board γ, and they were put under a high temperature atmosphere. As a result, it was found that the insulating property was deteriorated only in the board α and the board γ.

It is understood from the above that in the surroundings of wiring parts formed by printing and baking a conductive paste containing silver on an insulating substrate, part of the conductive paste composition is attached on the insulating substrate to deteriorate the insulating property between the wiring parts under the certain conditions. That is, it was understood from the verification experiment B1 that part of the conductive paste composition is attached on the insulating substrate by baking.

As the second step of the verification experiment B, the verification experiment B2 using a board δ and a board ε is described below with reference to FIGS. 4 to 6.

The board δ was formed by an insulating substrate b1 and a thick conductive paste a1 printed on the substantially whole surface of the substrate b1, as shown in FIG. 4. The board ε was formed by an insulating substrate f1 and gold wiring parts e1 formed thereon by using a gold material, which was confirmed not to cause insulation deterioration, as shown in FIG. 5.

The board δ and the board ε were arranged in such a manner that they faced to each other with a spacer c1 interposed therebetween to form an arbitrary gap d1, as shown in FIG. 6, and they were baked at a temperature of baking the conductive paste a1. A surface h of the insulating substrate f1 between the gold wiring parts e1 of the board E was observed with an EPMA apparatus, and it was confirmed that parts of the silver and the inorganic binder, which were the compositions of the conductive paste a1, were present on the surface h1.

The distribution of the silver and the inorganic binder was the substantially the same as the conductive paste a1 printed on the insulating substrate b1, i.e., the whole surface of the board δ. A voltage was applied between the gold wiring parts e1 in such a state, and it was confirmed that the insulating property between the gold wiring parts e1 was lowered under a high temperature atmosphere.

Accordingly, it can be said that parts of the silver and the inorganic binder are evaporated and scattered from the general conductive paste containing silver during the baking, i.e., in the verification experiment B2, they are scattered from the board δ to the board ε through the gap d1, and they are attached on the surface of the surrounding insulating substrate as a reaction product. That is, the route of attachment of the parts of the silver and the inorganic binder during the baking of the conductive paste was found from the verification experiment B2.

As the third step of the verification experiment B, the verification experiment B3 using the board δ and the board ε is described with reference to FIGS. 7A and 7B.

The board δ and the board ε were arranged in such a manner that they faced to each other with a spacer c2 to form an arbitrary gap g1, as shown in FIG. 7A. Further, the board δ and the board ε were arranged in such a manner that they faced to each other with a spacer c3 to form an arbitrary gap g2 shorter than the gap g1, as shown in FIG. 7B. As a result, the scattering distance of the reaction product could be changed between the devices shown in FIGS. 7A and 7B, and the amount of the reaction product attached on the board ε could also be changed therebetween.

That is, by changing the distance g1, g2 between the boards δ, ε, the amount of the silver attached on the board ε could be changed. The larger the distance g between the boards δ, ε, was, the smaller the attached amount of silver was. A voltage was applied between the wiring parts e1 of each of the devices shown in FIGS. 7A and 7B under a high temperature atmosphere. As a result, it was found that difference in insulation deterioration occurred depending on the attached amount of silver, as shown in FIG. 8. FIG. 8 is a graph showing the relationship between the attached amount of silver and the insulation failure time.

It can be said from the verification experiment B3 that occurrence of the phenomenon depends on the amount of silver existing as the reaction product on the surroundings of the wiring parts, and when the attached amount of silver is larger, the insulation deterioration is promoted.

Therefore, it was confirmed from the verification experiment B that the reaction product present on the surroundings of the wiring parts is scattered in the air during baking of the conductive paste and attached onto the insulating substrate, and the insulation deterioration is caused by the silver contained in the reaction product, which becomes conductive on application of a voltage under a high temperature atmosphere.

The high temperature leakage phenomenon would not be found because of the following reasons. In the conventional circuit board, a sealing structure was employed to prevent the migration of silver under an atmosphere containing water or water vapor. The reaction product causing the high temperature leakage phenomenon is normally not observed, and the appearance of the board is not changed even when silver of the reaction product becomes conductive to form a short circuit.

It can be said from the above that it is highly possible that the insulation failures that were considered to be caused by the migration of silver contain a certain number of cases due to the high temperature leakage phenomenon.

It is also considered from the above that because the substance (reaction product) to be a factor of the high temperature leakage phenomenon is formed and attached on the insulating substrate during the baking even under the conditions without water, the occurrence of the phenomenon in question is difficult to be prevented even by the sealing structure for preventing the migration of silver.

SUMMARY OF THE INVENTION

The invention has been made in view of the high temperature leakage phenomenon found by the inventors. An object of the invention is to suitably suppress insulation deterioration between wiring parts that occurs irrespective of presence or absence of water or water vapor when a voltage is applied between the wiring parts containing silver in a circuit board under a high temperature atmosphere.

In order not to cause silver contained in a reaction product to become conductive on application of a voltage under a high temperature atmosphere even when the reaction product (substance formed by chemical reaction of an inorganic binder and silver) is formed on the surroundings of the wiring parts by baking the conductive paste, Inventors give attention to providing a material for preventing the reaction product from being conductive between the wiring parts, i.e., a conductivity suppressing agent.

The present invention is made based on the above consideration, and relates to a circuit board comprising wiring parts containing silver, and a conductivity suppressing agent provided between the wiring parts, for preventing the silver attached between the wiring parts from being conductive.

According to the present invention, because the conductivity suppressing agent is present between the wiring parts, even when the reaction product is attached between the wiring parts, the silver contained in the reaction product does not become conductive. Therefore, the insulation deterioration between the wiring parts can be suitably suppressed, which usually occurs when a voltage is applied between the wiring parts containing silver on the circuit board under a high temperature atmosphere, irrespective of the presence or absence of water or water vapor. That is, the high temperature leakage phenomenon can be suitably suppressed.

When the conductivity suppressing agent is provided between the wiring parts, it must be well adhered to the insulating substrate such as an alumina substrate. In order to realize such good adhesion, it is preferable to use an insulating paste composition formed by an inorganic solid component containing the conductivity suppressing agent. In this case, the insulating paste composition can be well adhered to the insulating substrate by printing, baking, etc.

As a result of the experiment and investigation to find a suitable material as the conductivity suppressing agent, it was found that a potassium compound is preferred. Therefore, it is preferred that a potassium compound is used as the conductivity suppressing agent.

The circuit board is obtained when the wiring parts are formed by printing and baking a conductive paste composition containing silver on an insulating substrate, as described above. At this time, a potassium compound can be present between the wiring parts by coating an insulating paste composition containing the potassium compound by printing, etc., followed by a heat treatment of the conductive paste composition such as baking. A reaction product is formed by coating (such as printing) and baking the conductive paste composition as described above.

Simultaneously, the potassium compound previously provided and being present between the wiring parts becomes a potassium oxide or glass containing the same (hereinafter, referred to as potassium oxides) by the heat treatment. They are present in the reaction product formed from the conductive paste composition between the wiring parts, and suppress silver becoming conductive on application of voltage between the wiring parts under a high temperature atmosphere. Therefore, the high temperature leakage phenomenon can be well suppressed.

As a result of further investigation, it was found that the high temperature leakage phenomenon can suitably suppressed even when a potassium compound is contained in a conductive paste composition, which forms wiring parts of a circuit board by baking. Therefore, It is preferred that a potassium compound is contained in a conductive paste composition obtained by dispersing conductive metallic powder containing silver and an inorganic binder in an organic vehicle.

By using such a conductive paste composition, although the reaction product containing silver is attached on the surroundings of the wiring parts which is formed by coating (such as printing) and baking the conductive paste composition on an insulating substrate, the potassium compound contained in the conductive paste composition is also present in the reaction product in the form of the potassium oxide through evaporation during the baking. Therefore, the high temperature leakage phenomenon can be suitably suppressed by preventing insulation failure between the wiring parts using the above-described conductive paste composition of the invention.

The invention described above is based on the concept in that even when the reaction product is present on the surroundings of the wiring parts by baking, silver contained in the reaction product does is prevented from becoming conductive on application of voltage under a high temperature atmosphere by the potassium compound present between the wiring parts.

The inventors further conducted the following investigation and experiment. A no-inorganic-binder paste material containing no inorganic binder was produced by using a general conductive paste composition containing silver, and wiring parts were formed by printing and baking the no-inorganic-binder on an alumina ceramic substrate. It was confirmed that silver particles were present in an isolated state on the surroundings of the wiring parts by the observation with an SEM apparatus. When a voltage was applied between the wiring parts under a high temperature atmosphere, the insulating property between the wiring parts was not deteriorated.

It was also found that the silver powder as a component of the conductive paste composition was attached and present on the insulating substrate by baking; it began to evaporate at a baking temperature of 700° C.; and its attached amount suddenly increased when the baking temperature becomes about 800° C. or higher.

It can be said from the above that in the wiring parts formed by printing and baking the conductive paste containing silver, the reaction product containing silver, which is attached on the surroundings of the wiring parts to become a cause of insulation deterioration, is not formed without the inorganic binder.

Therefore, the high temperature leakage phenomenon, that is, the formation of the reaction product and the formation of conductivity of silver, are largely influenced by the composition of the inorganic binder within the conductive paste composition, the mixing ratio of the inorganic binder relative to the silver powder, and the composition of the insulating substrate used. Furthermore, the attached amount of the reaction product and its state of becoming conductive are also influenced, in addition to the above, by the density and the baking conditions of the conductive paste composition formed on the insulating substrate.

Therefore, giving attention to the possibility of suppressing the formation of the reaction product itself causing the insulation deterioration, experiments and investigations were conducted with respect to the inorganic binder, the insulating substrate and the baking conditions of the conductive paste composition obtained by dispersing a conductive metallic powder containing silver and an inorganic binder in an organic vehicle.

As a result, it was confirmed that there is an inorganic binder that can suppress the formation of the reaction product causing insulation deterioration. That is, in the conductive paste composition obtained by dispersing a conductive metallic powder containing silver and an inorganic binder in an organic vehicle, when a substance suppressing evaporation of silver is used as the inorganic binder, the formation of the reaction product causing the silver to be conductive can be suppressed, and thus the high temperature leakage phenomenon can be suitably prevented. As such an inorganic binder, a glass frit and a glass frit mixture can be employed.

Furthermore, the inorganic binder may be a bismuth oxide. The bismuth oxide evaporates during the baking of the conductive paste composition, and is present in the reaction product attached onto the insulating substrate. When the bismuth oxide is present in the reaction product, the reaction product is difficult to become conductive, and the larger the amount of the bismuth oxide, the more difficult to become conductive. The inorganic binder may be a mixture of a glass frit and the bismuth oxide.

Furthermore, based on the knowledge about the no-inorganic binder paste material as described above, a conductive paste composition containing no inorganic binder for forming the reaction product causing the silver therein to be conductivity may be employed. That is, a conductive paste composition comprising conductive metallic powder containing silver and an organic vehicle may be formed without inclusion of an inorganic binder.

The conductive paste composition is printed on a substrate, and the organic vehicle is evaporated by a drying treatment (at about from 100° C. to 150° C.), followed by baking. Therefore, only silver is started to evaporate during the baking, and is attached to the insulating substrate in the form of isolated silver. Even if a voltage is applied between the wiring parts under a high temperature atmosphere, where silver is present in the isolated form, the silver does not become conductive. Accordingly, a circuit board having good insulating property between the wiring parts can be obtained.

Furthermore, while the occurrence of the high temperature leakage phenomenon depends on the distance between the wiring parts (see FIG. 1), it is considered that this is affected by the scattering distance of the silver, etc. from the conductive paste composition. As a result of further investigation in this respect, it was found that the scattering distance of the silver is about 200 $\mu$m. Therefore, it is considered that the high temperature leakage phenomenon occurs when the distance between the wiring parts is about 400 $\mu$m or less. For example, in the general circuit board such as a hybrid IC board, the distance between the wiring parts is generally 500 $\mu$m or less, in which the high temperature leakage phenomenon is liable to occur. Therefore, it is effective to use the above-described insulating paste composition and the conductive paste composition in the circuit board in which the distance between the wiring parts is 500 $\mu$m or less.

The silver powder, as a component of the conductive paste composition, begins to evaporate at a baking temperature of 700° C. or higher, and its amount attached onto the substrate is suddenly increased at about 800° C. or higher. Thus, it is effective to use the above-described insulating paste composition and the conductive paste composition in a circuit board having wiring parts, which is heated at a temperature of 700° C. or higher.

Furthermore, the inventors confirmed that the high temperature leakage phenomenon is liable to occur when the substrate having wiring parts containing silver is an alumina substrate.

Based on the knowledge of the distance between the wiring parts, the baking conditions of the conductive paste composition, and the composition of the insulating substrate used, it is preferred to apply the insulating paste composition, the conductive paste composition, the circuit board, the method for using the insulating paste composition, the method for using the conductive paste composition, and the process for producing a circuit board that can suitably suppress the high temperature leakage phenomenon.

BRIEF DESCRIPTION OF THE DRAWINGS

FIG. 4 is a schematic view showing a substrate δ in the verification experiment B2;

FIG. 5 is a schematic view showing a substrate ε in the verification experiment B3;

FIG. 6 is a schematic view showing a state where the substrate δ and the substrate ε face to each other;

FIGS. 7A and 7B are schematic views showing states where substrate distances between the substrate δ and the substrate ε are varied;

FIG. 12 is a table showing compounds used in conductive paste compositions according to a second embodiment;

FIG. 13 is a table showing mixing ratios and various characteristics of samples 1 to 15 among the conductive paste compositions in the second embodiment;

FIG. 14 is a table showing mixing ratios and various characteristics of samples 16 to 31 among the conductive paste compositions in the second embodiment;

FIG. 15 is a table showing mixing ratios and high temperature leakage characteristics of the conductive paste compositions according to a third embodiment;

FIG. 17 is a table showing mixing ratios and various characteristics of the conductive paste compositions in the fourth embodiment; and FIG. 18 is a table showing mixing ratios and various characteristics of the conductive paste compositions in the fifth embodiment.

DESCRIPTION OF THE PREFERRED EMBODIMENTS (First Embodiment)

This embodiment relates to an insulating paste composition characterized in that a potassium compound is contained by an amount from 5 weight content to 30 weight content in terms of a potassium oxide relative to 100 weight content of an inorganic solid content. This embodiment can be applied to a circuit board comprising wiring parts containing silver formed on a substrate, between which a distance is 500 μm or less, a circuit board comprising wiring parts containing silver formed on a substrate that is heated to 700° C. or higher, and the like. Particularly, it is effective that the insulating paste composition of this embodiment is applied to the circuit board using an alumina substrate.

Figure 1:
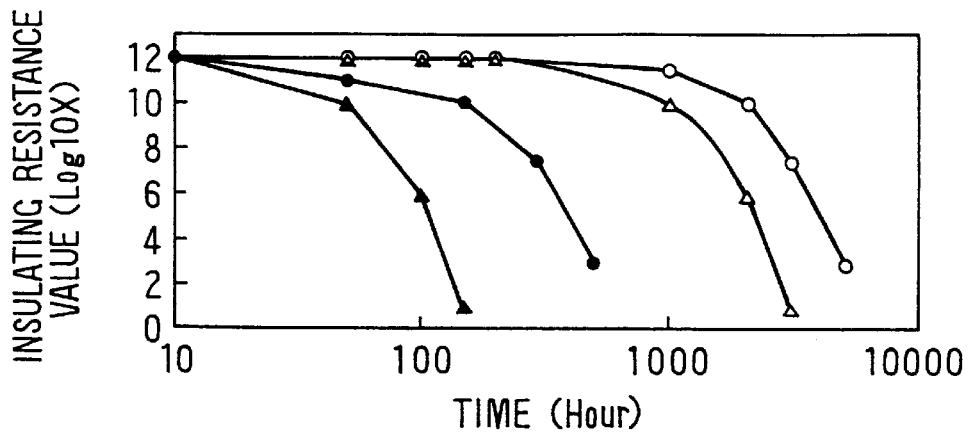
FIG. 1 is a graph showing relationships between elapsing time under a high temperature atmosphere and an insulation resistance value between wiring parts.
Figure 2:
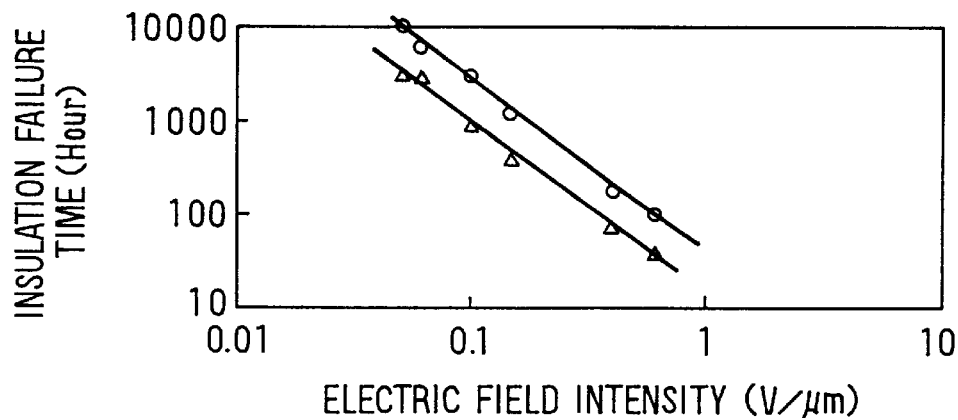
FIG. 2 is a graph showing relationships between electric field intensity applied to the wiring parts and insulation failure time.
Figure 3:
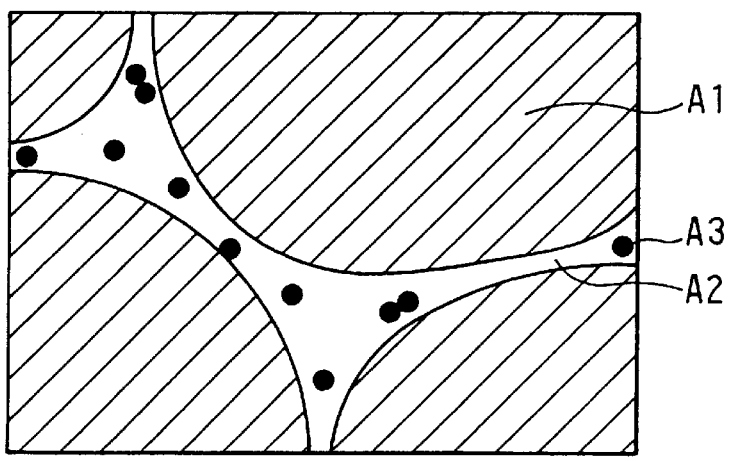
FIG. 3 is an enlarged schematic view based on the TEM observation of surroundings of the wiring parts on an insulating substrate.
Figure 8:
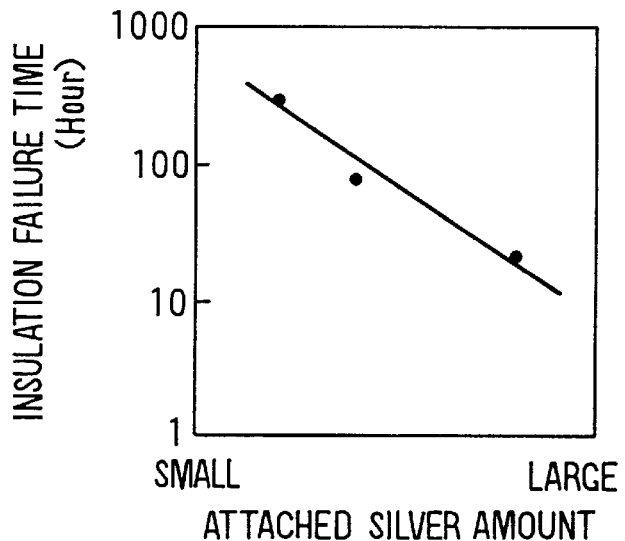
FIG. 8 is a graph showing a relationship between an attached amount of silver and the insulation failure time in the verification experiment B3.
Figure 9:
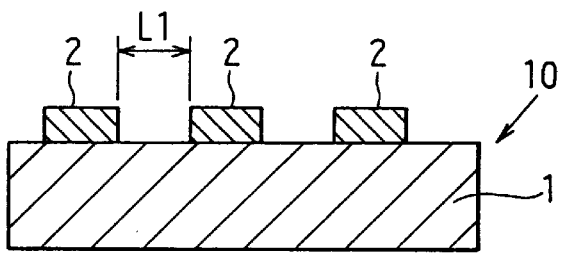
FIG. 9 is a cross sectional view showing the constitution of a circuit board according to a first embodiment.

FIG. 9 shows a cross sectional view of the circuit board according to the first embodiment. Numeral 10 denotes a circuit board, 1 denotes an alumina substrate which has an electrically-insulation property and comprises a glass substance and alumina powder, and 2 denotes wiring parts (thick film wiring parts) in the form of plural stripes containing silver formed on the substrate 1. The wiring parts 2 are arranged with a wiring distance L1 (for example, 100 μm) therebetween extending in the direction perpendicular to the paper. In this embodiment, a potassium oxide or glass containing the same (referred to potassium oxides hereinafter) is present between the wiring parts 2 on the substrate 1.

The circuit board 10 is obtained by forming the wiring parts 2 on the substrate 1. The wiring parts 2 is formed by printing and baking a conductive paste composition containing silver. Since potassium oxides are present in the reaction product formed during the baking of the conductive paste composition between the wiring parts 2, the reaction product is prevented from being conductive. As a result, a circuit board having a high insulating property between the wiring parts 2 can be obtained, and the high temperature leakage phenomenon can suitably suppressed.

As the potassium compound, potassium oxide, potassium gluconate, potassium hydroxide, potassium citrate and potassium hydrogen tartrate can be used.

The potassium compound is mixed in such a manner that its amount is from 5 weight content to 30 weight content in terms of potassium oxide relative to 100 weight content of the inorganic solid content, so as to produce the insulating paste composition of this first embodiment. As a result of investigation with respect to the amount of the potassium compound, it was confirmed that if the amount of the potassium compound is less than 5 weight content, the suppressing of silver being conductive is not sufficiently attained, and if it exceeds 30 weight content, the adhesion property between the insulating paste composition and the insulating substrate becomes insufficient.

Figure 10A:
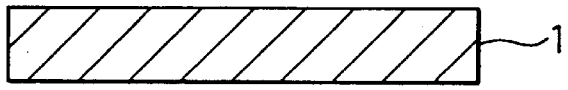
FIGS. 10A to 10C are explanatory views showing one example of the process for producing the circuit board using the insulating paste composition according to the first embodiment.
Figure 10B:
Figure 10C:
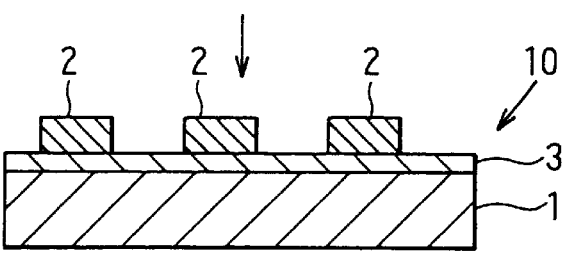
Figure 11A:
FIGS. 11A to 11D are explanatory views showing another example of the process for producing the circuit board using the insulating paste composition according to the first embodiment.
Figure 11B:
Figure 11C:
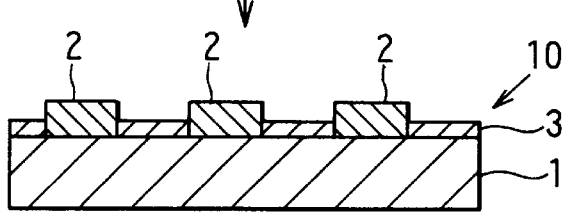
Figure 11D:
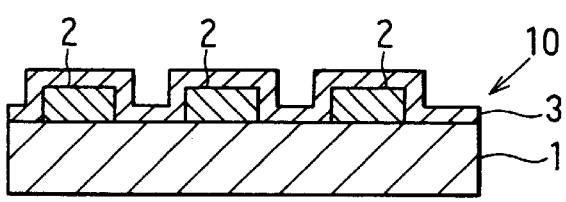

FIGS. 10A to 10C are explanatory views showing an example of the process for producing a circuit board using the insulating paste composition of the first embodiment.

The insulating paste composition 3 is previously applied on the substrate 1 before the printing of a conductive paste composition 2. As a result, the potassium compound can be present on at least the part between the wiring parts 2 of the substrate 1. At this time, the potassium compound may be present only at the part between the wiring parts by masking.

When the conductive paste composition is printed and baked, a reaction product is formed and scattered between the wiring parts 2 as well as on the wiring parts 2. Simultaneously, the potassium compound previously applied and present between the wiring parts 2 becomes potassium oxides by the baking (for example, at 700° C. or higher), and also is present in the reaction product formed by the conductive paste composition so as to prevent the reaction product from being conductive.

Before printing and baking the conductive paste composition, the insulating paste composition 3 may be subjected to a heat treatment to make the potassium compound into a state of potassium oxides.

In FIGS. 10A–10C and 11A–11D described later, while the resulting insulating paste composition 3 is illustrated in the form of a film for convenience, the potassium compound in the form of granules is dispersed on the substrate 1 since volatile components in the insulating paste composition are evaporated by the baking.

The application and the heat treatment of the insulating paste composition may be conducted on any occasion with respect to the printing and baking of the conductive paste composition, as described above. FIGS. 11A to 11D show another example of the process for producing a circuit board using the insulating paste composition of the first embodiment.

As shown in FIGS. 11A to 11D, after the printing of a conductive paste composition 2 on a substrate 1, an insulating paste composition 3 is coated (printed) on at least parts between wiring parts 2. Then, both of the pastes are baked simultaneously. Alternatively, the conductive paste composition may be printed and baked on the substrate 1 to form the wiring parts 2, and then the insulating paste composition 3 may be coated (printed) and baked so that the potassium oxide is present between the wiring parts 2. In the both methods, the potassium oxides can be present in the reaction product, and prevent the reaction product from being conductive.

The potassium compound or the potassium oxides supplied between the wiring parts 2 may be used in the form in which it is dissolved in a solvent. For example, a potassium hydroxide solution may be used.

The inorganic solid content may be a glass substance, which is a constitutional component of the ceramic substrate. The ceramic substrate is generally obtained by dispersing alumina powder and glass substance in a solvent, and being formed into a plate form, followed by sintering at from 800° C. to 1,200° C. At this time, the potassium compound becomes potassium oxides, and the potassium oxides are contained in the glass substance present at the alumina boundaries and in the surface part of the substrate 1. The glass substance is somewhat softened at the baking temperature of the conductive paste composition. When the conductive paste composition is printed and baked on the substrate 1, the reaction product formed during the baking is present as an attached layer on the substrate 1 in the state containing the potassium oxides within the glass substance. The reaction product containing the potassium oxides is prevented from being conductive, thereby obtaining a highly reliable circuit board, and the high temperature leakage phenomenon can suitably suppressed.

(Second Embodiment)

In this second embodiment, a potassium compound is contained in a conductive paste composition (thick film conductive paste) for forming wiring parts in the form of a thick film (thick film wiring parts) of a circuit board by baking. That is, the conductive paste composition (thick film conductive paste) obtained by dispersing conductive metallic powder containing silver and an inorganic binder in an organic vehicle further contains the potassium compound. The conductive paste composition of this embodiment is suitably used for the circuit boards, the same as those described in the first embodiment.

That is, the circuit board of the second embodiment has the similar constitution with that shown in FIG. 9. The thick film conductive paste comprising at least silver as a conductive metal and a potassium compound is printed and baked on an electrically-insulated substrate 1 formed by glass substance and alumina powder. Thus, wiring parts 2 are formed on the substrate 1 to obtain a circuit board 10. The potassium compound contained in the thick film conductive paste is evaporated along with the silver and the inorganic binder during the baking of the conductive paste. It is present as the potassium oxides in the reaction product.

Therefore, the reaction product containing silver is attached on the surroundings of the wiring parts 2, and the potassium oxides are present in the reaction product. The potassium oxides present in the reaction product have a function of inhibiting the reaction product from being conductive. Therefore, the high temperature leakage phenomenon can be suppressed. The larger the amount of the potassium oxides in the reaction product is, the larger the effect of preventing the reaction product from being conductive is.

As the conductive metallic powder, silver powder having been used in the thick film conductive paste can be used. The silver powder may contain palladium, platinum, gold, copper, etc. if necessary. Powder in which silver and the above-described metals are previously made in a form of alloy may be used.

The silver powder generally used has an average particle diameter from 0.5 $\mu$m to 7 $\mu$m and a specific surface area from 0.5 m$^2$/g to 3 m$^2$/g, and the powder of palladium, platinum and the like have an average particle diameter from 0.1 $\mu$m to 1 $\mu$m and a specific surface area from 10 m$^2$/g to 40 m$^2$/g.

The potassium compound may be potassium oxide, potassium carbonate and the like for forming potassium oxide or a glass substance containing potassium oxide during the baking of the thick film conductive paste, and an organic potassium compound, such as potassium gluconate, may also be used. The potassium compound may be in the form of potassium oxide on mixing, or may be a precursor that forms potassium oxide during the baking of the thick film conductive paste.

The necessary mixing amount of the potassium compound is extremely small. It may be directly mixed and dispersed in the thick film conductive paste as potassium oxide. Alternatively, it may be mixed as a component of the glass frit in the inorganic binder. The mixing amount of 0.01 weight content or more in terms of potassium oxide relative to 100 weight content of the conductive metallic powder can prevent insulation failure between the wiring parts 2. Taking the solder characteristics into consideration, the mixing amount of the potassium compound is preferably from 0.01 weight content to 0.4 weight content in terms of potassium oxide relative to 100 weight content of the conductive metallic powder. A part of the potassium compound mixed remains in the conductive film serving as the wiring parts in the form of glass along with the inorganic binder during the baking of the conductive paste. If a large amount of potassium oxide in the form of glass remains in the conductive film, it influences the solder characteristics of the conductive film. It was confirmed that when the mixing amount of the potassium compound exceeds 0.4 weight content, the potassium oxide adversely affects the solder characteristics of the conductive film although it is gradual.

When the potassium compound is used as the organic metallic compound, it may be dissolved in a solvent of the organic vehicle, or may be attached on the surface of the conductive metallic powder such as silver.

In the conductive paste composition of this second embodiment, a bismuth compound, a ruthenium compound and a nickel compound may be added to improve the solder characteristics.

The bismuth compound may be bismuth oxide or a precursor for forming bismuth oxide by baking. Furthermore, an organic compound such as bismuth octylate may be used. It may be mixed as a component of the glass frit in the inorganic binder. As bismuth oxide powder, dibismuth pentoxide pulverized into an average particle diameter of from 1 $\mu$m to 4 $\mu$m may be used. The bismuth compound mixed is present in the reaction product as similar to the potassium compound, and exhibits an effect of inhibiting the reaction product from being conductive. If an excess amount of the bismuth compound is added, it adversely influences the solder characteristics of the conductive film, as similar to the potassium compound.

The content of the bismuth compound is preferably from 0.1 weight content to 20 weight content in terms of bismuth oxide relative to 100 weight content of the conductive metallic powder to attain both the high temperature leakage characteristics (performance of suppressing the high temperature leakage phenomenon) and the solder characteristics.

The inorganic binder may be selected from those having been used for the thick film conductive paste, considering the combination of conventional inorganic binders that can attain various characteristics necessary in the conductive film after baking.

In some cases, the solder characteristics of the conductive film after baking are improved when a borosilicate zinc oxide series glass having a large zinc content, a vanadium compound, a copper compound, a manganese compound or a chromium compound is used as the inorganic binder powder of the thick film conductive paste. However, such a composition simultaneously has a tendency of deteriorating the high temperature leakage characteristics. Therefore, in relation to the solder characteristics, they are preferably mixed as far as the high temperature leakage characteristics are sufficient.

As the ruthenium compound, ruthenium oxide and a precursor such as ruthenium octylate that forms ruthenium oxide during the baking of the thick film conductive paste can be used. As ruthenium oxide powder, ruthenium dioxide powder having an average particle diameter from 1 $\mu$m to 10 $\mu$m and a specific surface area from 10 m$^2$/g to 50 m$^2$/g may be used.

As the nickel compound, nickel oxide powder and a precursor such as nickel metallic powder that forms nickel oxide during the baking of the thick film conductive paste can be used. As the nickel metallic powder, nickel powder having an average particle diameter from 0.1 $\mu$m to 2 $\mu$m and a specific surface area from 10 m$^2$/g to 20 m$^2$/g may be used.

The mixing of a suitable amount of the ruthenium compound extremely improves the solder characteristics, particularly the soldering property. When its mixing amount is increased, the insulation failure is liable to occur, but the solder characteristics are improved overriding the insulation failure. However, if it is mixed in an excess amount (more than 3 weight content in terms of the ruthenium oxide relative to 100 weight content of the conductive metallic powder), it is deposited on the surface of the conductive film depending on the baking conditions of the thick film conductive paste, thereby deteriorating the soldering property.

The mixing of a suitable amount of the nickel compound improves the solder characteristics, particularly the solder adhesion property. If it is mixed in an excess amount (more than 3 weight content in terms of nickel oxide relative to 100 weight content of the conductive metallic powder), the soldering property and the insulation property are gradually deteriorated, but their extents are small.

If the mixing amounts of the ruthenium compound and the nickel compound is less than 0.01 weight content in terms of the respective oxides relative to 100 weight content of the conductive metallic powder, they cannot attain their object of mixing (improvement in solder characteristics). Therefore, the contents of the ruthenium compound and the nickel compound are preferably from 0.01 weight content to 3 weight content in terms of the respective oxides, relative to 100 weight content of the conductive metallic powder.

As the organic vehicle, those having been used in the thick film conductive paste in which, for example, a resin such as ethyl cellulose is dissolved in an organic solvent such as terpineol and butyl carbitol, may be used. The mixing amount of the organic vehicle may be determined taking the viscosity and the flowability of the paste into consideration to attain printing suitably.

According to this second embodiment, the high temperature leakage characteristics newly found are satisfied with maintaining the various characteristics that are necessary in the conventional thick film conductive paste. Therefore, it has an effect of enhancing the mechanical and electric reliability of the thick film circuit board.

Specific examples showing the effects of the above-described additives are described below with reference to FIGS. 12 to 14. These examples only show the effects of the above-described additives as qualitative tendency, and their preferred contents should be quantitatively determined taking the components of the various conductive paste compositions into consideration.

FIG. 12 is a table showing the compounds used in the conductive paste compositions of the examples. In the table, the bismuth compounds A and B, the potassium compounds A to C, and the glass frits A to E correspond to the compounds or the mixtures shown in the right columns. The potassium compound C is a potassium-containing glass frit, in which $K_2O$ is contained in a glass frit. The unit of numbers in parentheses for the glass frits A to E is weight %.

The mixing ratios and the various characteristics of the conductive paste compositions of the specific examples are shown in FIG. 13 (samples 1 to 15) and FIG. 14 (samples 16 to 31). In both figures, Ru oxide means ruthenium oxide, and V oxide means vanadium oxide. In the figures, symbol ⊗ means the value including the amount of the potassium compound contained in the glass frit.

In an organic vehicle in which an ethyl cellulose resin is dissolved in terpineol, silver, palladium (Pd) or platinum as conductive metallic powder, and the bismuth compound, the potassium compound, the glass frit and the various inorganic binder powder shown in the table of FIG. 12 were mixed with the mixing ratios shown in the tables of FIGS. 13 and 14, followed by kneading and dispersing to produce 31 kinds of thick film conductive pastes for the samples 1 to 31. The samples 1, 3 and 30 are conductive paste compositions containing no potassium compound, which are used as comparative examples.

The resulting thick film conductive pastes were printed and dried on a 96% $Al_2O_3$ insulating substrate, and twice baked at 850° C. (peak) for 10 minutes by using a conveyer furnace, to produce thick film circuit boards provided with a conductive film having a film thickness from 9 $\mu$m to 13 $\mu$m. A screen having 325 mesh with the total thickness of 75 $\mu$m was used.

On the surface of the conductive film of each of the thus produced thick film circuit boards, a rosin flux was coated and a solder ball having a diameter of 1 mm composed of solder of 2 Ag/62 Sn/36 Pb was placed. Then, the circuit board was subjected to soldering-reflow at 230° C. for 15 seconds, and the height of the solder ball fused and spread was measured, which was taken as the index of the solder wettability.

After another set of thick film circuit boards were immersed in a rosin flux, those were immersed in a solder of 2 Ag/62 Sn/36 Pb at 250° C. for 5 seconds. A solder-plated copper wire having a diameter of 0.6 mm was soldered on a pad of 2×2 mm with a soldering iron with respect to each of them. Those were then put in an incubator at 150° C. for 1,000 hours, and the adhesion strength was measured by a peel test, which was taken as the index of the solder adhesion strength.

A DC voltage of 16 V was applied between the facing electrodes (electrode distance: 100 $\mu$m, length of facing electrode: 20 mm) of another set of thick film circuit boards, and those were put in an incubator at 150° C. for 1,000 hours. Samples exhibiting a resistance of 100 MΩ between the facing electrodes were given with acceptance, and the acceptance ratio (%) was taken as the index of the high temperature leakage characteristics.

The results are also shown in FIGS. 13 and 14. In the figures, the smaller solder wettability (unit: mm) is, the better, and the larger solder adhesion strength (unit: kg/2 mm□) is, the better.

It is understood from the comparison of the samples 1 and 3 (comparative examples) with the sample 2 that the high temperature leakage characteristics are greatly changed by the presence and absence of the potassium compound (100% for sample 2 against 20% and 50% for samples 1 and 3).

It is understood from the comparison of the samples 4, 5, 6, 7 and 8 that as the amount of the potassium compound contained is increased, the high temperature leakage characteristics are improved, but the solder characteristics are deteriorated. It is understood from the comparison of the samples 6, 9 and 10 that the high temperature leakage characteristics are good irrespective of the kind of the potassium compound, and the solder characteristics do not exhibit significant change in these samples.

It is understood from the comparison of the samples 6 and 11 that the kind of the bismuth compound added has no relationship with the high temperature leakage characteristics and the solder characteristics. It is understood from the comparison of the samples 6, 12, 13 and 14 that the kind of the glass frit contained has no relationship with the high temperature leakage characteristics and the solder characteristics. It is understood from the comparison of the samples 15, 16 and 17 that the kind of the conductive metallic powder has no relationship with the high temperature leakage characteristics and the solder characteristics.

It is understood from the comparison of the samples 18, 19, 20 and 21 that when the amount of the bismuth compound is too large, the solder wettability is deteriorated. It is understood from the comparison of the samples 19, 22, 23, 24 and 25 that as the amount of ruthenium oxide is larger, the solder adhesion strength is improved, but if its amount is too large, the high temperature leakage characteristics is deteriorated.

It is understood from the comparison of the samples 19, 26, 27, 28 and 29 that as the amount of nickel oxide becomes larger, the solder adhesion strength is improved.

It is understood from the comparison of the sample 30 (comparative example) to the sample 31 that even in the thick film conductive paste containing vanadium oxide, which is liable to cause leakage, the high temperature leakage characteristics can be good when the conductive paste contains the potassium compound.

By using the above described samples, investigation were conducted for the various components constituting the inorganic binder added to the thick film conductive paste in view of the suppressing of the insulation failure and the prevention of the lowering of the solder characteristics. As a result, the following conclusion is obtained.

The inorganic binder preferably contains at least a glass frit composed of one of glass comprising $B_2O_3$ from 3 weight % to 10 weight %, $SiO_2$ from 40 weight % to 60 weight %, $Al_2O_3$ from 10 weight % to 20 weight %, CaO from 15 weight % to 30 weight % and MgO from 0.5 weight % to 5 weight %, and glass comprising $B_2O_3$ from 5 weight % to 15 weight %, $SiO_2$ from 10 weight % to 20 weight %, PbO from 40 weight % to 70 weight % and ZnO from 10 weight % to 30 weight %.

Among the various oxides and glass frits used as the inorganic binder in the conventional general conductive paste composition, there are some examples containing substances present in the reaction product formed during the baking of the conductive paste composition and liable to be conductive (such as V, W, Mn, Mo, Cu and Zn).

The above-described glass frits do not contain such substances each of which is present in the reaction product and liable to be conductive, or even if they contains, their amount is extremely small. Therefore, the insulation failure is difficult to occur, and the characteristics necessary for the general conductive paste composition such as solder characteristics (adhesion property) can be sufficiently obtained.

Among the above-described glass frits, $B_2O_3$—$SiO_2$—$Al_2O_3$—CaO—MgO glass is amorphous glass having a softening point between 700° C. and 900° C., which is difficult to cause insulation failure. By using this glass frit along with the bismuth compound, the ruthenium compound or the nickel compound described above, the solder characteristics can be ensured.

Among the above-described glass frits, $B_2O_3$—$SiO_2$—PbO—ZnO glass is amorphous glass having a softening point between 400° C. and 600° C., which is difficult to cause insulation failure. It also has an inhibition effect of insulation failure as similar to the above-described potassium oxides ($K_2O$). Furthermore, this glass exhibits certain solder characteristics by itself.

When the ratio of the zinc component is increased in the glass frits, the solder characteristics are further improved, but the insulation failure is liable to occur. In the case where the potassium compound is mixed, if its mixing ratio is large, the effect of suppressing insulation failure becomes high, but the solder characteristics, particularly the soldering property, are deteriorated although it is gradual. In view of these points, the ratios of the elements constituting the above-described kinds of glass are preferred.

By further adding the ruthenium compound and the nickel compound to the conductive paste composition using the glass frit capable of suppressing insulation failure, further excellent solder characteristics can be obtained.

Furthermore, by mixing the inorganic binder, the bismuth compound, the ruthenium compound and the nickel compound in suitable ratios, a conductive paste composition suitable for the general circuit board under the general baking conditions can be obtained. That is, a conductive paste composition can be obtained, which is formed on an alumna substrate that is generally used in the thick film circuit board, of which baking temperature is about from 800° C. to 900° C., and which is optimized so that both the solder characteristics and the insulation property are excellent.

Such a conductive paste composition can be obtained by dispersing conductive metallic powder containing silver and an inorganic binder in an organic vehicle. The inorganic binder can be obtained by dispersing a glass frit of 2 weight content to 8 weight content comprising two kinds of glass, bismuth oxide of 4 weight content to 12 weight content, ruthenium oxide of 0.4 weight content to 1.6 weight content, and nickel oxide of 0.1 weight content to 0.4 weight content in the organic vehicle, relative to the conductive metallic powder of 100 weight content.

Among the two kinds of glass, first kind of glass is composed of $B_2O_3$ of 3 weight % to 10 weight %, $SiO_2$ of 40 weight % 60 weight %, $Al_2O_3$ of 10 weight % to 20 weight %, CaO of 15 weight % to 30 weight % and MgO of 0.5 weight % to 5 weight %, and second kind of glass is composed of $B_2O_3$ of 5 weight % to 15 weight %, $SiO_2$ of 10 weight % to 20 weight %, PbO of 40 weight % to 70 weight %, ZnO of 10 weight % to 30 weight % and $K_2O$ of 0.5 weight % to 5 weight %.

The conductive paste composition having the above-described characteristics can be produced by using an inorganic binder obtained by dispersing a glass frit of 0.1 weight content to 2 weight content, the glass frit comprising $SiO_2$ of 40 weight % to 70 weight %, ZnO of 5 weight % to 20 weight %, $Al_2O_3$ of 5 weight % to 20 weight %, CaO of 10 weight % to 30 weight % and $K_2O$ of 0.5 weight % to 15 weight %, bismuth oxide of 0.1 weight content to 6 weight content, and at least one of copper oxide and manganese oxide of 0.1 weight content to 2 weight content in the organic vehicle, relative to 100 weight content of the conductive metallic powder.

In the conductive paste compositions as described above, $K_2O$ in the glass frit in the inorganic binder attains the function of the potassium compound, so as to suppress insulation failure.

(Third Embodiment)

In the first and second embodiments described above, the high temperature leakage phenomenon is suitably suppressed in such a manner that even if the reaction product (substance resulting from the chemical reaction of the inorganic binder and silver) is present on the surroundings of the wiring parts by the baking of the conductive paste, silver contained in the reaction product is prevented from becoming conductive on application of voltage under a high temperature atmosphere.

In this third embodiment, the high temperature leakage phenomenon is suitably suppressed by employing a conductive paste composition that does not contain a component that is liable to cause the conduction in the inorganic binder. The conductive paste according to this third embodiment is also preferred for the similar circuit board as in the first and second embodiments.

Therefore, while the circuit board according to this third embodiment has the same constitution as that shown in FIG. 9, the potassium oxide is not present between the wiring parts 2. The conductive paste composition of this third embodiment is formed by dispersing conductive metallic powder containing silver and an inorganic binder composed of a glass frit as described later in a organic vehicle. The wiring parts 2 are formed on the electrically-insulated substrate 1 composed of glass substance and alumina powder by printing and baking (for example, 700° C. or higher) the conductive paste composition, so as to obtain the circuit board 10.

The inorganic binder is composed of the glass frit that does not contain a compound including at least the element that is liable to cause the conduction, such as V, Cr, Mo, Mn, W, Cu and Zn, as well as a precursor of the compound containing the element that is liable to cause the conduction.

The glass frit evaporates during the baking of the conductive paste and is attached onto the substrate as the reaction product. However, the reaction product is difficult to cause the conduction even when a voltage is applied between the wiring parts 2 under a high temperature atmosphere. Thus, the insulation failure between the wiring parts can be prevented, and the high temperature leakage phenomenon can suitably suppressed.

As the conductive metallic powder, silver powder used in the conventional conductive paste can be used. Further, the silver powder may comprise silver only and may contain palladium, platinum, gold and copper, if necessary. Powder previously made into an alloy of silver and the above-described metals may be used as the silver powder.

The silver powder generally used has an average particle diameter of 0.5 $\mu$m to 7 $\mu$m and a specific surface area of 0.5 $m^2$/g to 3 $m^2$/g. The powder of palladium, platinum, or the like has an average particle diameter of 0.1 $\mu$m to 1 $\mu$m and a specific surface area of 10 $m^2$/g to 40 $m^2$/g.

As the glass frit contained in the inorganic binder, B—Si—Al—Ca series high-temperature softening glass and B—Si—Pb series glass both having a softening point between 700° C. to 950° C. can be used. These kinds of glass can suppress evaporation of silver in the thick-film conductive paste as described above.

As the former glass, glass having composition of $B_2O_3$(10)—$SiO_2$(50)—$Al_2O_3$(15)—CaO(25) (the unit for numerals in parentheses is weight %) may be used. As the later glass, glass having composition of $B_2O_3$(10)—$SiO_2$(15)—PbO(75) (the unit for numerals in parentheses is weight %) may be used. The glass may be pulverized into an average particle diameter from 1 $\mu$m to 10 $\mu$m. The mixing amount of glass should be adjusted to be optimized to the various characteristics necessary in the conductive film after baking.

Because a temperature at which the B—Si—Al—Ca series high-temperature softening glass softens up is high when the conductive paste composition is baked, its vapor pressure is necessarily low. As a result, the attached amount of the reaction product on the substrate, which evaporates during the baking of the conductive paste and chemically reacts with silver, is lowered. High insulation property between the wiring parts can be thus obtained. Most of the glass frits generally used as the material of the thick film conductive paste have a softening point between 400° C. to 700° C. in view of their object of addition.

Since the B—Si—Pb series glass frit has a relatively low softening temperature, it is liable to evaporate during the baking of the conductive paste composition. Therefore, the ratio of the glass frit in the reaction product becomes high, thereby being difficult to cause the conduction of the reaction product. The glass frit is softened and melted at a temperature lower than a temperature at which silver vigorously evaporates (about 800° C.). Therefore, the molten glass frit covers a part or most of the silver powder, so as to reduce the exposed surface area of the silver and to inhibit the evaporation amount of the silver. As a result, the amount of silver attached as the reaction product is reduced to make difficult to cause the conduction of the reaction product.

The inorganic binder may be a mixture of the two glass frits described above.

Another inorganic binder may be obtained by selecting combinations suitable for the various characteristics necessary in the conductive film after baking among those having been used in the thick film conductive pastes.

As the organic vehicle, for example a resin such as ethyl cellulose dissolved in an organic solvent such as terpineol and butyl carbitol, that is, those having been used in the conventional thick film conductive pastes can be used. The mixing amount of the organic vehicle may be selected taking the viscosity and the flowability of the paste into consideration to attain the printing thereof suitably.

Specific examples of the third embodiment are described below with reference to FIG. 15, but this embodiment is not limited to those examples. FIG. 15 is a table showing the mixing ratios and the high temperature leakage characteristics of the conductive paste compositions according to the specific examples. The numerals in parentheses for the glass frits A and B shows mixing ratios of the respective components, and the unit thereof is weight %. The softening points of the glass frits A and B are 790° C. and 380° C., respectively.

In an organic vehicle obtained by dissolving an ethyl cellulose resin in terpineol, the conductive metallic powder, the glass frit and the other inorganic binder powder were mixed with the mixing ratios shown in FIG. 15, followed by kneading and dispersing, to produce five kinds of thick film conductive pastes for the samples 40 to 44.

The thick film conductive pastes thus produced are printed and dried on a 96% $Al_2O_3$ insulating substrate, and twice baked at 850° C. (peak) for 10 minutes by using a conveyer furnace, to produce thick film circuit boards provided with a conductive film having a film thickness of 9 $\mu$m to 13 $\mu$m. A screen having 325 mesh with the total thickness of 75 $\mu$m was used.

A voltage of DC 16 V was applied between the facing electrode parts (electrode interval: 100 $\mu$m, electrode facing length 20 mm) of the thick film circuit board produced, and it was put in an incubator at 150° C. for 1,000 hours. Samples exhibiting a resistance value of 100 MΩ between the electrodes were given with acceptance, and the acceptance ratio (%) was taken as the index of the high temperature leakage characteristics.

As shown in FIG. 15, the thick film circuit boards produced by using the samples 40 to 44 exhibit good high temperature leakage characteristics.

The conductive paste composition of this third embodiment may be those, to which the potassium compound is added thereto, as described in the second embodiment. In this case, the effect of the potassium compound can be obtained in addition to the effects of this third embodiment.

(Fourth Embodiment)

In the fourth embodiment, the amount of silver evaporating during the baking of the conductive paste is reduced by decreasing the content of silver in the conductive paste composition, so as to suitably suppress the high temperature leakage phenomenon. The conductive paste composition of this third embodiment is also applicable to the circuit board as described in the first to third embodiments.

While the circuit board according to this third embodiment has the same constitution as that in FIG. 9, the potassium oxide is not present between the wiring parts 2. The conductive paste composition of this third embodiment is formed by dispersing conductive metallic powder containing silver and an inorganic binder composed of at least one of a glass frit and a bismuth oxide in an organic vehicle, with predetermined ratio described later.

The conductive paste composition is printed and baked (for example, 700° C. or higher) on an electrically-insulating substrate 1 composed of glass substance and alumina powder to form wiring parts 2, so as to obtain a circuit board 10.

The conductive metallic powder and the inorganic binder is preferably mixed such that the content of the inorganic binder is 45 weight content or more relative to 100 weight content of the conductive metallic powder. If it is more than 45 weight content, the amount of silver attached onto the insulating substrate becomes large, and the insulation failure between the wiring parts cannot be prevented. The reason of this is shown in FIG. 16.

Figure 16:
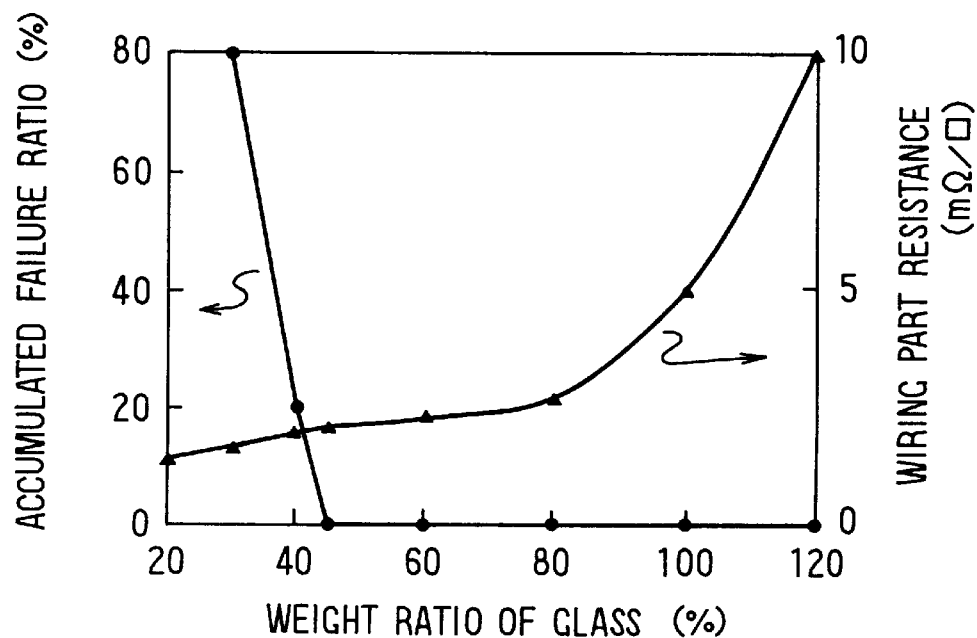
FIG. 16 is a graph showing a relationship between a weight ratio of glass part and an occurrence ratio of insulation failure and a relationship between the weight ratio of glass part and a resistance value between the wiring parts.

In FIG. 16, the abscissa shows the weight content (weight %) of glass indicating the content of the inorganic binder composed of at least one of a glass frit and a bismuth oxide relative to 100 weight content of the conductive metallic powder, the left ordinate shows the accumulated failure ratio (%) indicating the occurrence ratio of insulation failure due to the high temperature leakage phenomenon, and the right ordinate shows the resistance (mΩ/□) of the wiring parts formed by baking the conductive paste composition.

It is understood from FIG. 16 that when the content of the inorganic binder is 45 weight content or more, the accumulated failure ratio can be zero, and the high temperature leakage phenomenon can suitably suppressed. When it is less than 45 weight content, the amount of silver attached onto the insulating substrate becomes large. Therefore, the insulation failure between the wiring parts cannot be sufficiently prevented.

When it is 100 weight content or less, 5 mΩ/□ which is a desired value for the wiring resistance in the general circuit board, can be attained. Therefore, when the content of the inorganic binder is preferably from 45 weight content to 100 weight content relative to 100 weight content of the conductive metallic powder, both the prevention of insulation failure between the wiring parts and the good resistance characteristics of the wiring parts can be attained.

If it is more than 100 weight content, the wiring parts cannot exhibit its function since the resistance of the wiring parts becomes extremely high, or the soldering property thereof is deteriorated. There are some cases where the maximum addition amount of the inorganic binder becomes less than 100 weight content depending on the kind or composition of the conductive metallic powder used, and the composition of the inorganic binder. Therefore, the content of the inorganic binder should be optimized for each of the thick film conductive paste compositions.

As the conductive metallic powder, silver powder used in the conventional conductive paste can be used, and it may be composed of silver only and may contain palladium, platinum, gold and copper, if necessary. Powder previously made into an alloy of silver and the above-described metals may be used.

The silver powder generally used has an average particle diameter of 0.5 $\mu$m to 7 $\mu$m and a specific surface area of 0.5 $m^2/g$ to 3 $m^2/g$. The powder of palladium, platinum, or the like has an average particle diameter of 0.1 $\mu$m to 1 $\mu$m and a specific surface area of 10 $m^2/g$ to 40 $m^2/g$.

As the glass frit, borosilicate lead glass having been used in the conventional thick film conductive pastes can be used, and glass frits of any composition having a softening point of about 800° C. or lower can be used. As the glass frit powder, the above-described glass frits pulverized into an average particle diameter of 1 µm to 10 µm can be used. By using any of those glass frits, the inhibition of silver evaporation can be attained by its melting.

As the bismuth oxide powder, dibismuth pentoxide pulverized into an average particle diameter of 1 µm to 4 µm may be used. Because the bismuth oxide has good affinity with the silver powder and is melted at a baking temperature of about 800° C., the similar effects as the glass frit can be obtained.

As the organic vehicle, those having been used in the conventional thick film conductive pastes, such as a resin, e.g., ethyl cellulose, dissolved in an organic solvent, e.g., terpineol or butyl carbitol, may be used. The mixing amount of the organic vehicle may be selected taking the viscosity and the flowability of the paste into consideration to attain the printing of the paste suitably.

Specific examples of the fourth embodiment are described below with reference to FIG. 17, but this embodiment is not limited to those examples. FIG. 17 is a table showing the mixing ratios and the various characteristics described later (resistances and high temperature leakage characteristics) of the conductive paste compositions according to the specific examples. The numerals in parentheses for the glass frits A and B shows mixing ratios of the elements for the glass frits, and the unit thereof is weight %.

In an organic vehicle obtained by dissolving an ethyl cellulose resin in terpineol, the conductive metallic powder, the glass frit and the bismuth oxide powder were mixed with the ratios shown in FIG. 17, followed by kneading and dispersing, to produce thick film conductive pastes for the samples 50 to 56.

The thick film conductive pastes thus produced were printed and dried on a 96% $Al_2O_3$ insulating substrate, and twice baked at 850° C. (peak) for 10 minutes by using a conveyer furnace, to produce thick film circuit boards provided with a conductive film having a film thickness of 9 µm to 13 µm. A screen having 325 mesh with the total thickness of 75 µm was used.

The resistance values (unit: mΩ/□) of the conductive wiring parts on the thick film circuit board thus produced were measured.

Further, a DC voltage of 16 V was applied between the facing electrode parts (electrode interval: 100 µm, electrode facing length: 20 mm) of another set of thick film circuit boards, and those were put in an incubator at 150° C. for 1,000 hours. Samples exhibiting a resistance of 100 MΩ between the electrodes were given with acceptance, and the acceptance ratio (%) was taken as the index of the high temperature leakage characteristics.

The resistance values (unit: mΩ/□) and the results of the high temperature leakage characteristics are summarized in FIG. 17. In FIG. 17, the thick film circuit board produced by using the samples 50 to 56 exhibit good resistance value and high temperature leakage characteristics.

Since the sample 54 uses silver-Pd (palladium) inherently having a high resistance as the conductive metallic powder, the resistance value of the wiring parts is higher than the others. However, it is not out of the concept of the force embodiment. If silver or silver-platinum is used in the sample 54, the resistance value of the wiring parts can be the same level as the other samples.

The potassium compound described in the second embodiment may be added to the conductive paste compositions according to the fourth embodiment. In this case, the effects of the potassium compound described above can be obtained in addition to the effects of the fourth embodiment. Furthermore, the inorganic binder may be a mixture of a glass frit and a bismuth oxide.

(Fifth Embodiment)

The fifth embodiment is to provide a conductive paste composition that does not contain an inorganic binder that forms the reaction product causing the conduction along with silver. The conductive paste of this fifth embodiment is also applicable to the circuit board as described in the first to fourth embodiments.

While the circuit board according to this fifth embodiment has the same constitution as that in FIG. 9, the potassium oxide is not present between the wiring parts 2. The conductive paste composition of this fifth embodiment (thick film conductive paste) comprises conductive metallic powder containing silver and an organic vehicle, but does not contain an inorganic binder.

The conductive paste composition is printed and baked (for example, 700° C. or higher) on an electrically-insulating substrate 1 composed of glass substance and alumina powder to form wiring parts 2, so as to obtain a circuit board 10.

The conductive paste composition is printed on the substrate 1, and the organic vehicle is evaporated by a drying treatment (at a temperature from 100° C. to 150° C.), followed by baking. Therefore, only silver is started to evaporate during the baking of the conductive paste, and is attached onto the insulating substrate 1 in the form of isolated silver. Even if a voltage is applied between the wiring parts under a high temperature atmosphere, because only the isolated silver is present between the wiring parts, the silver does not become conductive. Accordingly, a circuit board having good insulating property between the wiring parts can be obtained.

As the conductive metallic powder, silver powder used in the conventional conductive pastes can be used, and it may comprise silver only and may contain palladium, platinum, gold and copper, if necessary. Powder previously made into an alloy of silver and the above-described metals may be used as the conductive metallic powder.

The silver powder generally used has an average particle diameter of 0.5 µm to 7 µm and a specific surface area of 0.5 $m^2/g$ to 3 $m^2/g$. The powder of palladium, platinum, or the like has an average particle diameter of 0.1 µm to 1 µm and a specific surface area of 10 $m^2/g$ to 40 $m^2/g$.

The conductive paste composition becomes, in some cases, insufficient in adhesion property with respect to the insulating substrate as an underlying substrate depending on the composition and the powder form of the conductive metallic powder containing silver, and the baking conditions thereof. Accordingly, it is preferable to add an adhesion strength assisting substance to the conductive paste composition, so as to ensure the adhesion property with respect to the insulating substrate.

As the adhesion strength assisting agent, at least one of a bismuth oxide, a copper oxide, a zinc oxide, a manganese oxide, a titanium oxide, a silicon oxide, a chromium oxide and a nickel oxide may be used.

When the conductive paste composition is baked, each of such oxides melts at a temperature below the baking temperature (for example, about 800° C.) and migrates to the boundary with the insulating substrate. The oxide having been migrated chemically reacts with the glass substance constituting the insulating substrate at a high temperature. The adhesion property of the wiring parts with respect to the insulating substrate can be improved by the reaction. Its addition amount may be a slight amount that does not influence on the insulation property between the wiring parts.

Specifically, as the bismuth oxide powder, dibismuth pentoxide pulverized into an average particle diameter of 1 µm to 4 µm may be used. As the copper oxide powder, copper suboxide pulverized into an average particle diameter of 0.5 µm to 3 µm may be used. Furthermore, manganese dioxide, nickel oxide, zinc oxide, dichromium trioxide, titanium dioxide and silicon dioxide pulverized into an average particle diameter of 0.1 am to 3 µm may be used.

As the organic vehicle, those having been used in the thick film conductive pastes, such as a resin, e.g., ethyl cellulose, dissolved in an organic solvent, e.g., terpineol or butyl carbitol, may be used. The mixing amount of the organic vehicle may be selected taking the viscosity and the flowability of the paste into consideration to attain the printing of the paste suitably.

Specific examples of the fifth embodiment are described below with reference to FIG. 18, but this embodiment is not limited to those examples. FIG. 18 is a table showing the mixing ratios and the various characteristics described later (resistances and high temperature leakage characteristics) of the conductive paste compositions according to the specific examples.

In an organic vehicle obtained by dissolving an ethyl cellulose resin in terpineol, the conductive metallic powder, and dibismuth pentoxide, copper suboxide, manganese dioxide, nickel oxide, zinc oxide, dichromium trioxide, titanium dioxide and silicon dioxide, which are the adhesion strength assisting substance, were mixed with the ratios shown in FIG. 18, followed by kneading and dispersing, to produce thick film conductive paste compositions for the samples 63 to 70.

The thick film conductive pastes thus produced were printed and dried on a 96% $Al_2O_3$ insulating substrate, and twice baked at 850° C. (peak) for 10 minutes by using a conveyer furnace, to produce thick film circuit boards provided with a conductive film having a film thickness of 9 µm to 13 µm. A screen having 325 mesh with the total thickness of 75 µm was used.

After the thick film circuit boards thus produced were immersed in a rosin flux, it was immersed in a solder of 2 Ag/62 Sn/36 Pb at 250° C.c for 5 seconds, and a solder-plated copper wire having a diameter of 0.6 mm was soldered on a pad of 2×2 mm with a soldering iron. The adhesion strength was then measured by a peel test, which was taken as the index of the solder adhesion strength (unit: kg/2 mm□).

A DC voltage of 16 V was applied between the facing electrodes (electrode interval : 100 µm, length of facing electrode: 20 mm) of another set of thick film circuit boards, and those were put in an incubator at 150° C. for 1,000 hours. Samples exhibiting a resistance of 100 MΩ between the electrodes were given with acceptance, and the acceptance ratio was taken as the index of the high temperature leakage characteristics.

As shown in FIG. 18, the thick film circuit boards produced as the samples 60 to 70 exhibit good high temperature leakage characteristics and the thick film circuit boards of the samples 63 to 70 shows a certain level of the solder adhesion strength by the adhesion strength assisting substance.

Even when the adhesion strength assisting substance is not used, those exhibiting poor solder adhesion strength can be arranged and fixed on the substrate by such a manner that the wiring parts formed is covered with a sealing agent, etc.

The potassium compound described in the second embodiment may be added to the conductive paste composition of this fifth embodiment. In this case, the effects of the potassium compound described above can be obtained in addition to the effects of this fifth embodiment.

What is claimed is:

1. A conductive paste composition comprising:

an organic vehicle;

conductive metallic powder containing silver dispersed in said organic vehicle, and an inorganic binder dispersed in said organic vehicle, wherein said conductive paste composition further contains a potassium compound, wherein said potassium compound is either one of a potassium oxide and a precursor of said potassium oxide, and wherein said precursor of said potassium oxide is an organic potassium compound.

2. A conductive paste composition comprising:

an organic vehicle;

conductive metallic powder containing silver dispersed in said organic vehicle; and an inorganic binder dispersed in said organic vehicle, wherein said conductive paste composition further contains a potassium compound, and wherein said inorganic binder contains glass frit formed by at least one of glass which is composed of $B_2O_3$ of 3–10 weight %, $SiO_2$ of 40–60 weight %, $Al_2O_3$ of 10–20 weight %, CaO of 15–30 weight % and MgO of 0.5–5 weight %, and glass which is composed of $B_2O_3$ of 5–15 weight %, $SiO_2$ of 10–20 weight %, PbO of 40–70 weight % and ZnO of 10–30 weight %.

3. A conductive paste composition according to claim 2, wherein said inorganic binder contains at least one of a ruthenium compound and a nickel compound.

4. A conductive paste composition according to claim 3, wherein each of said ruthenium compound and said nickel compound is either one of an oxide thereof and a precursor of said oxide.

5. A conductive paste composition according to claim 3, wherein a content of each of said ruthenium compound and said nickel compound is 0.01–3 weight content in terms of an oxide thereof, relative to 100 weight content of said conductive metallic powder.

6. A conductive paste composition comprising:

an organic vehicle;

conductive metallic powder containing silver dispersed in said organic vehicle; and an inorganic binder dispersed in said organic vehicle, wherein said conductive paste composition further contains a potassium compound, and said inorganic binder contains glass frit formed by at least one of glass which is composed of $B_2O_3$ of 3–10 weight %, $SiO_2$ of 40–60 weight %, $Al_2O_3$ of 10–20 weight %, CaO of 15–30 weight % and MgO of 0.5–5 weight %, and glass which is composed of $B_2O_3$ of 5–15 weight %, $SiO_2$ of 10–20 weight %, PbO of 40–70 weight % and ZnO of 10–30 weight %.

7. A conductive paste composition according to claim 6, wherein said potassium compound is either one of a potassium oxide and a precursor of said potassium oxide.

8. A conductive paste composition according to claim 7, wherein said precursor of said potassium oxide is an organic potassium compound.

9. A conductive paste composition according to claim 7, wherein said inorganic binder contains glass frit, and said potassium oxide is contained as one component of said glass frit.

10. A conductive paste composition according to claim 6, wherein a content of said potassium compound is 0.01–0.4 weight content in terms of a potassium oxide relative to 100 weight content of said conductive metallic powder.

11. A conductive paste composition according to claim 6, further comprising a bismuth compound.

12. A conductive paste composition according to claim 11, wherein said bismuth compound is either one of a bismuth oxide and a precursor of said bismuth oxide.

13. A conductive paste composition according to claim 11, wherein a content of said bismuth compound is 0.1–20 weight content in terms of a bismuth oxide relative to 100 weight content of said conductive metallic powder.

14. A conductive paste composition according to claim 6, wherein said inorganic binder contains at least one of a ruthenium compound and a nickel compound.

15. A conductive paste composition according to claim 14, wherein each of said ruthenium compound and said nickel compound is either one of an oxide thereof and a precursor of said oxide.

16. A conductive paste composition according to claim 14, wherein a content of each of said ruthenium compound and said nickel compound is 0.01–3 weight content in terms of an oxide thereof, relative to 100 weight content of said conductive metallic powder.

17. A conductive paste composition comprising:

an organic vehicle;

conductive metallic powder containing equal to or more than 80 weight % of silver dispersed in said organic vehicle; and an inorganic binder dispersed in said organic vehicle, wherein said conductive paste composition further contains a potassium compound, and wherein said potassium compound is either one of a potassium oxide and a precursor of said potassium oxide.

18. A conductive paste composition according to claim 17, wherein said precursor of said potassium oxide is an organic potassium compound.

19. A conductive paste composition according to claim 17, wherein said inorganic binder contains glass frit, and said potassium oxide is contained as one component of said glass frit.

20. A conductive paste composition comprising:

an organic vehicle;

conductive metallic powder containing equal to or more than 80 weight % of silver dispersed in said organic vehicle, and an inorganic binder dispersed in said organic vehicle, wherein said conductive paste composition further contains a potassium compound, and wherein said inorganic binder contains glass frit formed by at least one of glass which is composed of $B_2O_3$ of 3–10 weight %, $SiO_2$ of 40–60 weight %, $Al_2O_3$ of 10–20 weight %, CaO of 15–30 weight % and MgO of 0.5–5 weight %, and glass which is composed of $B_2O_3$ of 5–15 weight %, $SiO_2$ of 10–20 weight %, PbO of 40–70 weight % and ZnO of 10–30 weight %.

21. A conductive paste composition according to claim 20, wherein said inorganic binder contains at least one of a ruthenium compound and a nickel compound.

22. A conductive paste composition according to claim 21, wherein each of said ruthenium compound and said nickel compound is either one of an oxide thereof and a precursor of said oxide.

23. A conductive paste composition according to claim 21, wherein a content of each of said ruthenium compound and said nickel compound is 0.01–3 weight content in terms of an oxide thereof, relative to 100 weight content of said conductive metallic powder.

* * * * *